(12) United States Patent  
Kobayashi et al.

(10) Patent No.: US 9,196,512 B2
(45) Date of Patent: Nov. 24, 2015

(54) FOCUS RING AND MANUFACTURING METHOD THEREFOR

(75) Inventors: Yoshiyuki Kobayashi, Nirasaki (JP); Jun Watanabe, Shibukawa (JP); Takuya Okada, Omuta (JP); Tomoyuki Nara, Shibukawa (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 654 days.

(21) Appl. No.: 13/166,046

(22) Filed: Jun. 22, 2011

(65) Prior Publication Data

US 2011/0315318 A1  Dec. 29, 2011

(30) Foreign Application Priority Data

Jun. 23, 2010 (JP) ................. 2010-143017

(51) Int. Cl.
*C23F 1/08* (2006.01)
*B05D 1/12* (2006.01)
*B05D 5/00* (2006.01)
*B05D 3/06* (2006.01)
*H01L 21/67* (2006.01)
*H01J 37/32* (2006.01)
*H01L 21/687* (2006.01)

(52) U.S. Cl.
CPC ..... *H01L 21/67103* (2013.01); *H01J 37/32642* (2013.01); *H01L 21/68735* (2013.01)

(58) Field of Classification Search
USPC ............ 156/345.52, 345.53, 345.43, 345.47; 118/723 R, 724, 725
See application file for complete search history.

(56) References Cited

U.S. PATENT DOCUMENTS

| 3,875,065 | A | * | 4/1975 | Rosenblum | 210/388 |
| 3,879,065 | A | * | 4/1975 | Kobayashi | 285/39 |
| 5,163,551 | A | * | 11/1992 | Bhatia | 206/725 |
| 5,730,803 | A | * | 3/1998 | Steger et al. | 118/723 R |
| 7,261,925 | B2 | * | 8/2007 | Nesbitt | 427/470 |
| 2007/0037315 | A1 | * | 2/2007 | Maghribi et al. | 438/82 |
| 2008/0006207 | A1 | * | 1/2008 | Miyagawa et al. | 118/724 |
| 2008/0236746 | A1 | * | 10/2008 | Oyabu et al. | 156/345.23 |
| 2011/0315318 | A1 | * | 12/2011 | Kobayashi et al. | 156/345.27 |

FOREIGN PATENT DOCUMENTS

| JP | 2002-016126 A | 1/2002 |
| JP | 2008-244096 A | 10/2008 |
| JP | 2008-251742 A | 10/2008 |

* cited by examiner

*Primary Examiner* — Sylvia R MacArthur
(74) *Attorney, Agent, or Firm* — Pearne & Gordon LLP

(57) ABSTRACT

There is provided a focus ring capable of preventing a part of a heat transfer sheet from adhering to and remaining on a mounting table. The focus ring is arranged to surround a periphery of a substrate mounted on the mounting table having a temperature control device. Further, the focus ring includes a flexible heat transfer sheet. Furthermore, the focus ring is in contact with the mounting table via the heat transfer sheet, and the heat transfer sheet has a contact surface in contact with the mounting table and an anti-adhesion layer formed on the contact surface.

8 Claims, 10 Drawing Sheets

FOCUS RING AND MANUFACTURING METHOD THEREFOR

CROSS-REFERENCE TO RELATED APPLICATION

This application claims the benefit of Japanese Patent Application No. 2010-143017 filed on Jun. 23, 2010, the entire disclosures of which are incorporated herein by reference.

FIELD OF THE INVENTION

The present disclosure relates to a focus ring and a manufacturing method therefor; and, more particularly, to a focus ring in contact with a mounting table via a heat transfer sheet and a manufacturing method for the focus ring.

BACKGROUND OF THE INVENTION

When a plasma process, e.g., an etching process is performed on a wafer used as a substrate, etching rates at respective portions of the wafer may be affected by temperatures of those respective portions. Thus, it has been required to maintain a temperature of the entire surface of the wafer uniformly during the etching process.

A substrate processing apparatus configured to perform the etching process on the wafer includes an evacuable chamber for accommodating therein the wafer and a mounting table (susceptor) located within the chamber for mounting thereon the wafer. Plasma is generated within the depressurized chamber and the wafer is etched by the plasma.

The susceptor has a cylindrical shape, and the wafer is mounted on the top of the susceptor. Further, a focus ring is provided on the susceptor so as to surround a periphery of the wafer mounted on the susceptor. The focus ring is made of substantially the same material as the wafer. Due to the presence of such a focus ring, the plasma can be distributed to above the focus ring as well as above the wafer, so that the etching process can be uniformly performed on the entire surface of the wafer.

When the etching process is performed on the wafer, the wafer is heated by the plasma and the temperature of the wafer may be varied resultantly. The temperature of the wafer affects a distribution of radicals in the plasma that exists above the wafer and also affects a reaction between the wafer and the radicals. Thus, if a temperature of a wafer belonging to a lot varies, it may become difficult to perform uniform etching processes on a multiple number of wafers in the same lot. Here, the susceptor includes a temperature control device, and when an etching process is performed on the wafers in the same lot, the wafers are cooled and the temperature of each wafer is controlled to a desired temperature.

When the etching process is performed on the wafer, a focus ring is also heated by the plasma and the temperature of the focus ring may also be varied. If the temperature of the focus ring varies, a temperature of a periphery of the wafer may also be varied by being affected by the focus ring. Thus, when the etching processes are performed on the wafers belonging to the same lot, the temperature of the focus ring is also controlled to a desired temperature by the temperature control device. Since, however, the focus ring is just mounted on the susceptor, adhesiveness between the focus ring and the susceptor is low and a minute gap may exist between the focus ring and the susceptor, resulting in low heat conductivity between the focus ring and the susceptor. As a result, it has been difficult to control the temperature of the focus ring to the desired temperature.

Recently, to solve this problem, the present applicant has been developing a method of controlling the temperature of the focus ring effectively by the temperature control device of the susceptor by improving the heat conductivity between the focus ring and the susceptor (see, for example, Patent Document 1). In this method, a heat transfer sheet is provided between the focus ring and the susceptor to improve the heat conductivity therebetween.

The heat transfer sheet is made of a flexible heat-resistant material such as heat-resistant silicon rubber such that the heat transfer sheet can be transformed so as to fill the minute gap between the focus ring and the susceptor. Further, for example, alumina particulates serving as fillers can be mixed in this material in order to improve the heat conductivity.

Whenever the plasma etching process is performed, the focus ring would also be etched and consumed, and if the accumulated time of the etching processes exceeds about 500 hours, the focus ring would be consumed to the extent that it is no more able to perform its function. Accordingly, the focus ring needs to be replaced whenever the accumulated time of the etching process exceeds 500 hours.

Patent Document 1: Japanese Patent Laid-open Publication No. 2002-16126.

However, as compared to the focus ring of which surface is smoothly formed by machining, a surface of the susceptor is covered with thermally sprayed ceramic (e.g., alumina or yttria) and thus has high surface roughness. Further, since the heat transfer sheet is flexible, the heat transfer sheet is likely to adhere to a surface having high surface roughness. Accordingly, if the focus ring is separated from the susceptor in order to replace the focus ring, a part of the heat transfer sheet may adhere to and remain on the susceptor.

The residual heat transfer sheet adhering to the surface of the susceptor may be peeled off at a certain timing and likely to adhere to the wafer as foreign substances. Thus, the residual heat transfer sheet attached to the susceptor needs to be removed when the focus ring is replaced.

Here, since it is difficult to take the suceptor out of the chamber, the heat transfer sheet needs to be removed while the susceptor is still located within the chamber. Thus, the removal of the heat transfer sheet has been time-consuming, and complete removal thereof has been difficult.

BRIEF SUMMARY OF THE INVENTION

In view of the foregoing, the present disclosure provides a focus ring capable of preventing a part of a heat transfer sheet from adhering to and remaining on a mounting table and also provides a manufacturing method for the focus ring.

In accordance with one aspect of the present disclosure, there is provided a focus ring arranged to surround a periphery of a substrate mounted on a mounting table having a temperature control device. The focus ring includes a flexible heat transfer sheet. Further, the focus ring is in contact with the mounting table via the heat transfer sheet, and the heat transfer sheet has a contact surface in contact with the mounting table and an anti-adhesion layer formed on the contact surface.

Further, the anti-adhesion layer may be a part of the heat transfer sheet. Furthermore, the anti-adhesion layer may be formed by irradiating an ultra-violet ray to the contact surface to harden the contact surface.

Further, the anti-adhesion layer may contain peelable heat conductive particulates on the contact surface.

Further, the peelable heat conductive particulates may contain boron nitride or graphite.

Further, the anti-adhesion layer may contain peelable heat conductive particulates. Furthermore, the anti-adhesion layer may be formed by irradiating an ultra-violet ray to the contact surface to harden the contact surface.

Further, the heat transfer sheet may be formed in an annular shape. Furthermore, the anti-adhesion layer may not be formed on an area of the contact surface within at least about 1 mm from an inner periphery of the heat transfer sheet toward an outer periphery thereof in a radial direction.

Further, a width of the anti-adhesion layer in the radial direction may be equal to or larger than about 50% of a width of the contact surface in the radial direction.

Further, an Asker C hardness of the heat transfer sheet may be in a range from about 3 to about 60.

Further, a storage modulus of the heat transfer sheet at a temperature of about 25° C. may be in a range from about 0.5 MPa to about 10 MPa.

Further, the anti-adhesion layer may be formed by irradiating the ultraviolet ray having a wavelength of about 120 nm to about 400 nm at an illuminance of about 1 mW/cm$^2$ to 1000 mW/cm$^2$ such that a total irradiation amount is in a range from about 10 mJ/cm$^2$ to about 1,000,000 mJ/cm$^2$.

In accordance with still another aspect of the present disclosure, there is provided a method for manufacturing a focus ring having a flexible heat transfer sheet and arranged to surround a periphery of a substrate mounted on a mounting table having a temperature control device. The focus ring is in contact with the mounting table via the heat transfer sheet. Further, the method includes forming an anti-adhesion layer by hardening a part of the heat transfer sheet by way of irradiating an ultraviolet ray to a contact surface of the heat transfer sheet in contact with the mounting table.

In accordance with another aspect of the present disclosure, there is provided a method for manufacturing a focus ring having a flexible heat transfer sheet and arranged to surround a periphery of a substrate mounted on a mounting table having a temperature control device. The focus ring is in contact with the mounting table via the heat transfer sheet. Further, the method includes forming an anti-adhesion layer by distributing peelable heat conductive particulates to a contact surface of the heat transfer sheet in contact with the mounting table.

Further, the peelable heat conductive particulates may be sprayed onto the contact surface.

Further, forming an anti-adhesion layer may include mixing the peelable heat conductive particulates into a sol-type curable material; and coating the mixed curable material on the contact surface.

Further, forming an anti-adhesion layer may include hardening a part of the heat transfer sheet to form the anti-adhesion layer by irradiating an ultraviolet ray to the contact surface such that the part of the heat transfer sheet contains the peelable heat conductive particulates.

In accordance with the present disclosure, since the heat transfer sheet has the anti-adhesion layer formed on the contact surface in contact with the mounting table, the heat transfer sheet can be prevented from adhering to the mounting table. Thus, when the focus ring is separated from the mounting table, it is possible to prevent a part of the heat transfer sheet from adhering to and remaining on the mounting table.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 3A illustrates a state of a quasi heat transfer sheet remaining on a member corresponding to a focus ring in accordance with a comparative example 1; FIG. 3B illustrates a state of the quasi heat transfer sheet adhering to a member corresponding to a susceptor in accordance with the comparative example 1; FIG. 3C illustrates a state of a quasi heat transfer sheet remaining on a member corresponding to a focus ring in accordance with an experimental example 1; and FIG. 3D illustrates a state of the quasi heat transfer sheet adhering to a member corresponding to a susceptor in accordance with the experimental example 1;

FIG. 5A illustrates a state of a quasi heat transfer sheet remaining on a member corresponding to a focus ring in accordance with a comparative example 2; FIG. 5B illustrates a state of the quasi heat transfer sheet adhering to a member corresponding to a susceptor in accordance with the comparative example 2; FIG. 5C illustrates a state of a quasi heat transfer sheet remaining on a member corresponding to a focus ring in accordance with an experimental example 2; and FIG. 5D illustrates a state of the quasi heat transfer sheet adhering to a member corresponding to a susceptor in accordance with the experimental example 2;

DETAILED DESCRIPTION OF THE INVENTION

Hereinafter, embodiments of the present disclosure will be described in detail with reference to the accompanying drawings.

First, a focus ring in accordance with a first embodiment of the present disclosure will be discussed.

Figure 1:
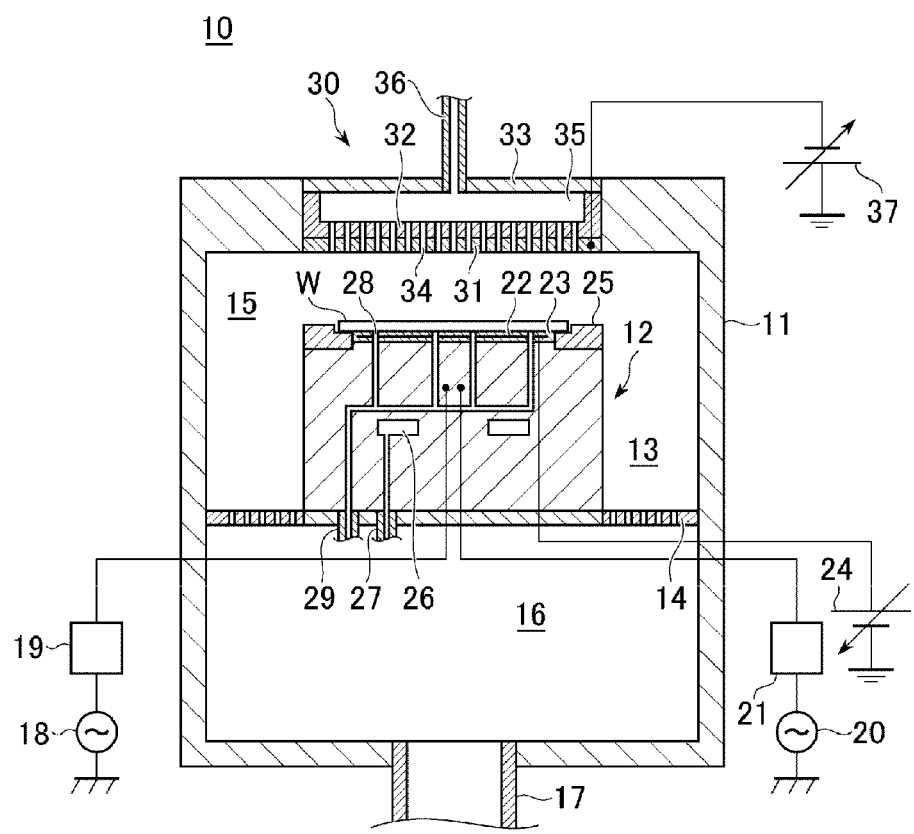
FIG. 1 is a longitudinal cross sectional view schematically showing a configuration of a plasma processing apparatus having a focus ring in accordance with a first embodiment of the present disclosure.

FIG. 1 is a cross sectional view schematically illustrating a configuration of a plasma processing apparatus including the focus ring in accordance with the first embodiment. The plasma processing apparatus performs a plasma etching process on a wafer used as a substrate for a semiconductor device (hereinafter, simply referred to as a "wafer").

In FIG. 1, a plasma processing apparatus 10 may include a chamber 11 configured to accommodate therein a wafer W having a diameter of, e.g., about 300 mm. A circular column-shaped susceptor (mounting table) 12 for mounting thereon the wafer W is provided within the chamber 11. In the plasma processing apparatus 10, a side exhaust path 13 is formed between an inner sidewall of the chamber 11 and a side surface of the susceptor 12. An exhaust plate 14 is provided at a midway of the side exhaust path 13.

The exhaust plate 14 is a plate-shaped member provided with a multiple number of through holes, and the exhaust plate 14 serves as a partition plate that divides the chamber 11 into an upper part and a lower part. As will be described later, plasma is generated in the upper part (hereinafter, referred to as a processing room) 15 of the chamber 11 above the exhaust plate 14. Further, an exhaust pipe 17 for exhausting a gas within the chamber 11 is connected to the lower part (hereinafter, referred to as an exhaust room (manifold)) 16 of the chamber 11 below the exhaust plate 14. The exhaust plate 14 prevents diffusion of the plasma generated within the processing room 15 or reflects the plasma, thus preventing leakage of the plasma into the manifold 16.

A TMP (Turbo Molecular Pump) and a DP (Dry Pump) (both are not shown) are connected to the exhaust pipe 17, and these pumps evacuate and depressurize the inside of the chamber 11. To be specific, the DP depressurizes the inside of the chamber 11 to an intermediate vacuum state (e.g., about $1.3 \times 10$ Pa (0.1 Torr) or less) from an atmospheric pressure, and, in cooperation with the DP, the TMP further depressurizes the inside of the chamber 11 to a high vacuum state (e.g., about $1.3 \times 10^{-3}$ Pa ($1.0 \times 10^{-5}$ Torr) or less) lower than the intermediate vacuum state. Further, an internal pressure of the chamber 11 is controlled by an APC valve (not shown).

A first high frequency power supply 18 is connected to the susceptor 12 within the chamber 11 via a first matching unit 19, and a second high frequency power supply is connected to the susceptor 12 via a second matching unit 21. The first high frequency power supply 18 applies a high frequency power of a relatively low frequency (e.g., about 2 MHz) for ion attraction to the susceptor 12, and the second high frequency power supply 20 applies a high frequency power of a relatively high frequency (e.g., about 60 MHz) for plasma generation to the susceptor 12. In this configuration, the susceptor 12 serves as an electrode. Further, the first matching unit 19 and the second matching unit 21 reduce reflection of the high frequency powers from the susceptor 12 to thereby maximize the efficiency of applying the high frequency powers to the susceptor 12.

A surface of the susceptor 12 may be covered with plasma-resistant ceramic, e.g., alumina ($Al_2O_3$) or yttria ($Y_2O_3$). Further, an upper part of the susceptor 12 is formed in a shape in which a circular column having a smaller diameter is protruded from a top end of a circular column having a larger diameter coaxially, and a step-shaped portion is formed at the upper part so as to surround the circular column having the smaller diameter. Provided on a top end of the circular column having the smaller diameter is an electrostatic chuck 23 made of ceramics and having an electrostatic electrode plate 22 embedded therein.

The electrostatic electrode plate 22 is connected with a DC power supply. If a positive DC voltage is applied to the electrostatic electrode plate 22, a negative potential may be generated in a surface (hereinafter, referred to as a "rear surface") of the wafer W facing the electrostatic chuck 23, and, thus, a potential difference may be generated between the electrostatic electrode plate 22 and the rear surface of the wafer W. The wafer W may be attracted to and held by the electrostatic chuck 23 by a Coulomb force or a Johnsen-Rahbek force generated due to the potential difference.

A focus ring 25 is mounted on the step-shaped portion at the upper part of the susceptor 12 so as to surround the wafer W held on the electrostatic chuck 23. The focus ring 25 may be made of silicon (Si), silicon carbide (SiC), or the like. That is, since the focus ring 25 is made of a semi-conductive material, a distribution range of the plasma may be extended to above the focus ring 25 from above the wafer W. Thus, a plasma density above a peripheral area of the wafer W is maintained at substantially the same level as a plasma density above a central area of the wafer W, so that uniformity of the plasma etching process performed on the entire surface of the wafer W can be obtained.

Provided within the susceptor 12 is, for example, an annular coolant cavity 26 (temperature control device) extended along the periphery of the susceptor 12. A low-temperature coolant such as cooling water or Galden (registered trademark) is supplied into and circulated through the coolant cavity 26 from a chiller unit (not shown) through a coolant line 27. The susceptor 12 cooled by the low-temperature coolant may cool the wafer W and the focus ring 25.

The electrostatic chuck 23 is provided with a multiple number of heat transfer gas supply holes 28 opened toward the wafer W electrostatically held by the electrostatic chuck 23. The heat transfer gas supply holes 28 are connected with a heat transfer gas supply unit (not shown) via a heat transfer gas supply line 29, and the heat transfer gas supply unit supplies a helium (He) gas serving as a heat transfer gas into a gap between a top surface of the electrostatic chuck 23 and the rear surface of the wafer W through the heat transfer gas supply holes 28. The helium (He) gas supplied into the gap between the top surface of the electrostatic chuck 23 and the rear surface of the wafer W effectively transfers heat of the wafer W to the susceptor 12.

Further, the focus ring 25 may have a heat transfer sheet 38 to be described later on its surface 40 (hereinafter, referred to as a "susceptor facing surface") facing the step-shaped portion at the upper part of the susceptor 12. The heat transfer sheet 38 may fill a minute gap between the susceptor facing surface 40 and the step-shaped portion (more specifically, a focus ring mounting surface 39 of the step-shaped portion), so that heat conductivity between the focus ring 25 and the susceptor 12 may be improved and heat of the focus ring 25 can be effectively transferred to the susceptor 12.

A shower head 30 is provided at a ceiling of the chamber 11 so as to face the susceptor 12. The shower head 30 may include an upper electrode plate 31, a cooling plate that supports the upper electrode plate 31 in a detachable manner and a cover 33 that covers the cooling plate 32. The upper electrode plate 31 is configured as a circular plate-shaped member having a multiple number of gas holes 34 formed through the upper electrode plate 31 in a thickness direction, and the upper electrode plate 31 is made of silicon as a semi-conductive material. Further, a buffer room 35 is provided within the cooling plate 32, and a processing gas inlet pipe 36 is connected to the buffer room 35.

The upper electrode plate 31 of the shower head 30 is connected with a DC power supply 37 and a negative DC voltage is applied to the upper electrode plate 31. Thus, a negative potential is generated in the upper electrode plate 31, and the upper electrode plate 31 emits secondary electrons due to collision of positive ions attracted to the upper electrode plate 31 by the negative potential to thereby prevent a decrease in electron density within the processing room 15.

In the plasma processing apparatus 10, a processing gas supplied into the buffer room 35 from the processing gas inlet pipe 36 is introduced into the processing room 15 through the gas holes 34. The introduced processing gas is then excited into plasma by the high frequency power for plasma generation applied to the inside of the processing room 15 from the second high frequency power supply 20 via the susceptor 12. Ions in the plasma are attracted toward the wafer W by the high frequency power for ion attraction applied to the susceptor 12 from the first high frequency power supply 18, and the plasma etching process is performed on the wafer W.

An operation of each component of the above-described plasma processing apparatus 10 may be controlled by a CPU of a controller (not shown) of the plasma processing apparatus 10 according to a program associated with the plasma etching process.

Figure 2:
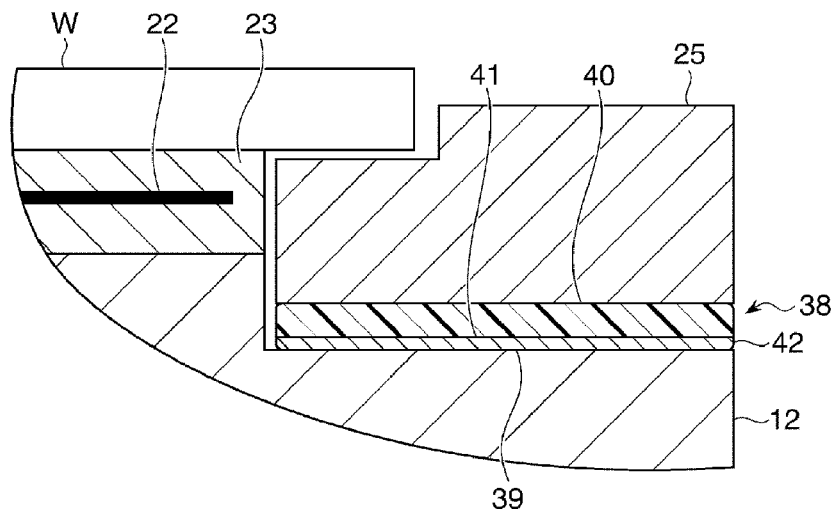
FIG. 2 is an enlarged cross sectional view schematically illustrating the focus ring, a heat transfer sheet and a part in the vicinity of a focus ring mounting surface in the plasma processing apparatus of FIG. 1.

FIG. 2 is an enlarged cross sectional view schematically illustrating the focus ring, the heat transfer sheet and a part in the vicinity of the focus ring mounting surface in the plasma processing apparatus of FIG. 1.

As depicted in FIG. 2, a planar portion of the step-shaped portion of the susceptor 12 is configured as the focus ring mounting surface 39 on which the focus ring 25 is mounted and which is in contact with the focus ring 25. When the focus ring 25 is mounted on the focus ring mounting surface 39, the heat transfer sheet 38 of the focus ring 25 comes into contact with the focus ring mounting surface 39 and fills the minute gap between the susceptor facing surface 40 and the focus ring mounting surface 39. Accordingly, the heat conductivity between the focus ring 25 and the susceptor 12 may be improved, and the heat of the focus ring 25 can be effectively transferred to the susceptor 12, thus cooling the focus ring 25.

Here, since the temperature of the focus ring 25 may increase to about 200° C. even if the focus ring 25 is cooled by the susceptor 12, the heat transfer sheet 38 needs to have heat resistance and to be maintained in its shape at such a high temperature. Accordingly, a heat-resistant organic material, e.g., a heat-resistant adhesive or rubber containing silicon components (hereinafter, referred to as a "silicon-containing heat-resistant material") is used as a base material of the heat transfer sheet 38. Further, a multiple number of heat conductive fillers are mixed into the heat transfer sheet 38, and the heat conductive fillers are distributed (dispersed) in the heat transfer sheet 38. By way of example, the heat conductive fillers may be alumina particulates and the heat conductive fillers may improve heat conductivity of the heat transfer sheet 38. For example, the heat-resistant organic material may be a heat-resistant epoxy, or an organic material may be appropriately selected depending on the kind of the plasma etching process. By way of example, an organic material capable of being coated on the susceptor facing surface 40 in a sol state (not cross-linked yet) and being gelated later by itself or by being cross-linked by heating may be used.

Prior to conceiving the focus ring in accordance with the present embodiment, the present inventor has conducted experiments for preventing adhesion of a heat transfer sheet by using test pieces.

Figure 3A:
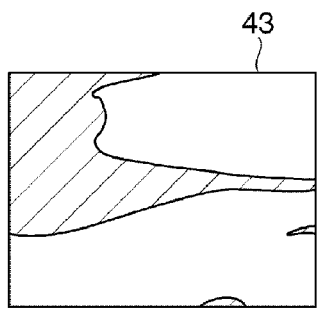
FIGS. 3A to 3D are diagrams showing experimental results of preventing adhesion of quasi heat transfer sheets in accordance with the first embodiment.
Figure 3C:
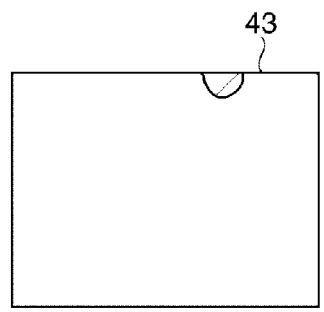
Figure 3B:
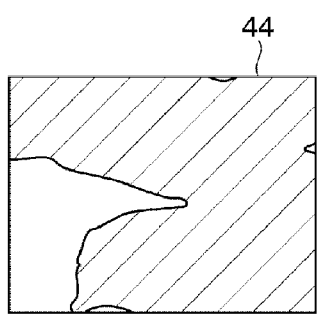

To elaborate, in a comparative example 1, a test piece 43 cut off from a silicon wafer was prepared as a member corresponding to the focus ring 25, and a test piece 44 made of an aluminum plate of which surface is coated with thermally sprayed alumina was prepared as a member corresponding to the susceptor 12. Then, a quasi heat transfer sheet was formed by coating a sol-type silicon-containing heat-resistant material on the test piece 43 and gelating this material by a cross-linking reaction. The test piece 43 and the test piece 44 were kept attached to each other with the quasi heat transfer sheet interlayered therebetween under a weight of about 50 g/cm$^2$ in an atmosphere of about 60° C. Thereafter, the test piece 43 and the test piece 44 were separated, and a state of the quasi heat transfer sheet remaining on the test piece 43 (FIG. 3A) and a state of the heat transfer sheet adhering to the test piece 44 (FIG. 3B) were observed. In FIGS. 3A and 3B, white parts represent the quasi heat transfer sheet.

Further, the quasi heat transfer sheet was fabricated as follows. First, XE14-B8530(A) (manufactured by Momentive Performance Materials Inc.) and XE14-B8530(B) (manufactured by Momentive Performance Materials Inc.) were used as polyorganosiloxane and mixed at a weight ratio of about 1:1, so that a mixed solution (hereinafter, referred to as a "mixed solution A") was prepared. Then, DAM5 (manufactured by DENKI KAGAKU KOGYO KABUSHIKI KAISHA. and having an average particle diameter of about 5 μm) was added to the mixed solution A as an alumina filler at a ratio (volume ratio) of mixed solution A:alumina filler=60:40. Further, RD-1 (manufactured by Toray Dow Corning Co., Ltd.) serving as a crosslinkable polyorganosiloxane-based hardener was added to and mixed with the mixture of the mixed solution A and the alumina filler such that an amount of the RD-1 was about 0.04 weight % of the sum of the weights of the mixed solution A and the alumina filler. A solution thus obtained (hereinafter, referred to as a "mixed solution B") was used as a sol-type silicon-containing heat-resistant material. Then, the mixed solution B was coated on the test piece 43 and heated at a temperature of about 150° C. for about 30 hours. As a result, a cross-linking reaction occurred and the mixed solution B was gelated into a hardened body, so that a quasi heat transfer sheet was obtained. Further, when measured by a laser flash method by using the test piece 43 on which only the mixed solution B was hardened, heat conductivity of the quasi heat transfer sheet was about 1.2 W/m·K. Further, an Asker C hardness of the hardened body was measured to be about 25 by an Asker C hardness tester. Further, as an elastic modulus of the hardened body, a storage modulus at about 25° C. was measured to be about 1.7 MPa by a dynamic viscoelastic spectrum.

Figure 3D:
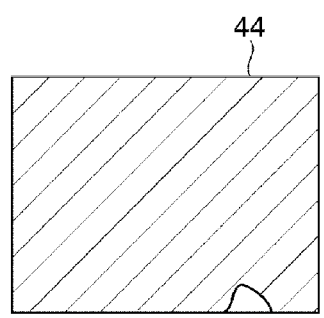

Then, in an experimental example 1, a test piece 43 and a test piece 44 were prepared as in the comparative example 1, and a sop-type silicon-containing heat-resistant material, the same as used in the comparative example 1, was coated on the test piece 43 and gelated into a hardened body by being heated at about 150° C. for about 30 hours, so that a quasi heat transfer sheet was formed. Thereafter, an anti-adhesion layer was formed on a surface of the quasi heat transfer sheet by irradiating an ultraviolet ray to the quasi heat transfer sheet. Then, the test piece 43 and the test piece 44 were kept firmly attached to each other for about one hour under the same conditions as in the comparative example 1 so as to allow the anti-adhesion layer to be in firm contact with the test piece 44. Thereafter, the test piece 43 and the test piece 44 were separated, and a state of the quasi heat transfer sheet remaining on the test piece 43 (FIG. 3C) and a state of the heat transfer sheet adhering to the test piece 44 (FIG. 3D) were observed. In FIGS. 3C and 3D, white parts represent the quasi heat transfer sheet. Further, as conditions for the irradiation of the ultraviolet ray, a Xe-type Excimer lamp (manufactured by USHIO Inc.) was used as a light source and an ultraviolet ray having a wavelength of about 172 nm was irradiated at an illuminance of about 15 mW/cm$^2$ for about 400 seconds (total irradiation amount of about 6000 mJ/cm$^2$).

In the comparative example 1, about 30% of the quasi heat transfer sheet was found to be transferred from the test piece 43 to the test piece 44 and adhere to the test piece 44. In the experimental example 1, however, most of the quasi heat transfer sheet was observed not to be transferred to the test piece 44 from the test piece 43 and the quasi heat transfer sheet was found to hardly adhere to the test piece 44. That is, it was proved that adhesion of a part of the heat transfer sheet to the test piece 44 can be prevented by providing on the quasi heat transfer sheet the anti-adhesion layer which is formed by irradiating the ultraviolet ray to harden the anti-adhesion layer.

Furthermore, in a comparative example 2, a test piece 43 and a test piece 44 were prepared as in the comparative example 1, and a sol-type silicon-containing heat-resistant material, the same as used in the comparative example 1, was coated on the test piece 43 and gelated into a hardened body by being heated at about 150° C. for about 30 hours, so that a quasi heat transfer sheet was formed. Thereafter, an ultraviolet-ray processed layer was formed on a surface of the quasi heat transfer sheet by irradiating an ultraviolet ray having a wavelength of about 172 nm to the quasi heat transfer sheet at an illuminance of about 0.8 mW/cm$^2$ for about 10 seconds (total irradiation amount of about 8 mJ/cm$^2$) by using an Xe-type Excimer lamp (manufactured by USHIO Inc.) as a light source. Further, the test piece 43 and the test piece 44 were kept firmly attached to each other for about one hour under the same conditions as those in the comparative example 1 so as to allow the ultraviolet-ray processed layer to be in firm contact with the test piece 44. Thereafter, the test piece 43 and the test piece 44 were separated, and a state of the quasi heat transfer sheet remaining on the test piece 43 and a state of the heat transfer sheet adhering to the test piece 44 were observed.

Meanwhile, in a comparative example 3, a test piece 43 and a test piece 44 were prepared as in the comparative example 1, and a sol-type silicon-containing heat-resistant material, the same as used in the comparative example 1, was coated on the test piece 43 and gelated into a hardened body by being heated at about 150° C. for about 30 hours, so that a quasi heat transfer sheet was formed. Thereafter, an ultraviolet-ray processed layer was formed on a surface of the quasi heat transfer sheet by irradiating an ultraviolet ray having a wavelength of about 172 nm to the quasi heat transfer sheet at an illumination of about 2000 mW/cm$^2$ for about 1000 seconds (total irradiation amount of 2,000,000 mJ/cm$^2$) by using an Xe-type Excimer lamp (manufactured by USHIO Inc.) as a light source. Further, the test piece 43 and the test piece 44 were kept firmly attached to each other for about one hour under the same conditions as those in the comparative example 1 so as to allow the ultraviolet-ray processed layer to be in firm contact with the test piece 44. Thereafter, the test piece 43 and the test piece 44 were separated, and a state of the quasi heat transfer sheet remaining on the test piece 43 and a state of the heat transfer sheet adhering to the test piece 44 were observed.

In the comparative example 2, about 20% of the quasi heat transfer sheet was found to be transferred from the test piece 43 to the test piece 44 and adhere to the test piece 44. The reason for this is deemed to be as follows. Since the illuminance and the total irradiation amount of the ultraviolet ray are small, a cross-linking density of the ultraviolet-ray processed layer may not be increased sufficiently higher than that of most of the quasi heat transfer sheet. Thus, an anti-adhesion effect may not be sufficiently achieved and, as a result, adhesion of a part of the quasi heat transfer sheet to the test piece 44 may not be prevented. Moreover, in a comparative example 3, about 70% of a quasi heat transfer sheet was found to be transferred from a test piece 43 to a test piece 44 and adhere to the test piece 44. The reason for this is deemed to be as follows. Since the illuminance and the total irradiation amount of the ultraviolet ray are excessively great, a chain of polymer in the ultraviolet-ray processed layer may be cut and a molecular weight thereof may be decreased. Thus, it is deemed that a cross-linking density of the ultraviolet-ray processed layer may become lower than that of most of the quasi heat transfer sheet, causing a greater amount of the quasi heat transfer sheet to adhere to the test piece 44. That is, it was proved that by irradiating the ultraviolet ray to the quasi heat transfer sheet at an appropriate illuminance and an appropriate total irradiation amount, an anti-adhesion layer having a cross-linking structure with a high cross-linking density can be formed, thus preventing adhesion of a part of the quasi heat transfer sheet to the test piece 44.

The focus ring in accordance with the present disclosure has been derived from the above considerations. To elaborate, in accordance with the present embodiment, the heat transfer sheet 38 may have an anti-adhesion layer 42 formed on its surface 41 (hereinafter, referred to as a "susceptor contact surface") in contact with the focus ring mounting surface 39 in order to prevent adhesion of the heat transfer sheet 38 to the focus ring mounting surface 39.

The anti-adhesion layer 42 may be formed through the steps of forming the heat transfer sheet 38 by coating, on the susceptor facing surface 40, a sol-type silicon-containing heat-resistant material mixed with a multiple number of heat conductive fillers and gelating the coated silicon-containing heat-resistant material into a hardened body by a cross-linking reaction and then irradiating an ultraviolet ray to the susceptor contact surface 41 of the heat transfer sheet 38. Accordingly, the anti-adhesion layer 42 may be a part of the heat transfer sheet 38.

As for the focus ring 25 in accordance with the present embodiment, the heat transfer sheet 38 has the anti-adhesion layer 42 that is formed on the susceptor contact surface 41 by the irradiation of the ultraviolet ray and is a part of the heat transfer sheet 38. Accordingly, the anti-adhesion layer 42 does not adhere to the focus ring mounting surface 39 and it can be prevented that a part of the heat transfer sheet 38 adheres to and remains on the focus ring mounting surface 39 when the focus ring 25 is separated from the susceptor 12.

As for the above-described heat transfer sheet 38, a part of the heat transfer sheet 38 on the side of the susceptor contact surface 41 is converted into the anti-adhesion layer 42. Although most of the heat transfer sheet has a cross-linking structure and is gelated to the hardened body, the anti-adhesion layer 42 has a cross-linking structure having a higher cross-linking density than that of most of the heat transfer sheet because the anti-adhesion layer 42 is formed by irradiating the ultraviolet ray to the part of the heat transfer sheet 38 on the side of susceptor contact surface 41. Accordingly, the heat transfer sheet 38 can be transformed flexibly, so that the minute gap between the susceptor facing surface 40 and the focus ring mounting surface 39 can be filled effectively. Moreover, since it is not necessary to mix a foreign substance such as a hardener into the heat transfer sheet 38 for the formation of the anti-adhesion layer 42, deterioration of heat conductivity may be avoided.

Further, in order to obtain a flexibly transformable sheet, a silicon-containing heat-resistant adhesive or rubber may be used as the base material of the heat transfer sheet. Further, an oxide, a nitride or a carbide ceramics filler may be used as the heat conductive filler to be mixed into the heat transfer sheet. Further, if the filler is contained in the heat-resistant adhesive or rubber at a ratio of about 25 volume % to about 60 volume %, the heat transfer sheet may be able to uniformly transfer heat over the entire region thereof, so that a temperature of the entire focus ring can be uniformly controlled.

In addition, if the heat conductivity of the heat transfer sheet is within a range from about 0.5 W/m·K to about 5.0 W/m·K, the temperature of the focus ring can be easily controlled by the temperature control device of the mounting table. Especially, if the heat conductivity of the heat transfer sheet is within a range from about 1.0 W/m·K to about 2.0 W/m·K, the temperature of the focus ring can be readily controlled by the temperature control device of the mounting table and the heat transfer sheet may be allowed to have a good follow-up property to the contact surface having irregularities or a high surface roughness between the mounting table and the focus ring.

Moreover, the silicon-containing heat-resistant adhesive or rubber used in the present embodiment may not be particularly limited as long as it contains silicon. By way of example, polyorganosiloxane composed of a siloxane unit as a main chain structure and having a crosslinkable reaction point may be used. Further, curable (thermosetting) polyorganisiloxane may be used, and a hardener (crosslinkable polyorganosiloxane) in addition to polyorganosiloxane serving as a base material may also be used. A repeated unit structure of the polyorganosiloxane may be a dimethylsiloxane unit, a phenylmethylsiloxane unit, a diphenylsiloxane unit or the like. Furthermore, modified polyorganosiloxane having a functional group such as a vinyl group or an epoxy group may also be used.

In order to easily coat the polyorganosiloxane on the focus ring, a polyorganosiloxane having an average molecular amount equal to or larger than about 10,000 and equal to or smaller than about 50,000 and a viscosity of about 500 mPa·s to about 10,000 mPa·s can be used.

Furthermore, the heat conductive filler contained in the heat transfer sheet may be an oxide, a nitride or a carbide ceramics filler. To elaborate, alumina, magnesia, zinc oxide, silica, or the like may be used as an oxide; aluminum nitride, boron nitride, silicon nitride or the like may be used as a nitride; and silicon carbide or the like may be used as a carbide. The ceramics filler may have a spherical structure. If the ceramics filler has anisotropy in shape, it may be desirable to orient the ceramics filler such that heat conductivity thereof is maximized. By way of example, alumina, zinc oxide, aluminum nitride, boron nitride, silicon nitride, or silicon carbide may be used as the ceramics filler to meet the above-mentioned characteristics.

Further, in order to easily coat on the focus ring the silicon-containing heat-resistant material having therein the heat conductive filler on the focus ring easily, the heat conductive filler having an average particle diameter equal to or larger than about 1.5 µm and smaller than about 4.5 µm can be used.

Further, a maximum particle diameter of the heat conductive filler may be equal to or smaller than about 80 µm, and, desirably, equal to or smaller than about 20 µm. Moreover, as for a particle size distribution, it may be desirable that at least two maximum values exist within a range equal to or larger than about 4.5 µm and smaller than about 6.5 µm, a range equal to or larger than about 1.5 µm and smaller than about 4.5 µm and a range equal to or larger than about 0.3 µm and smaller than about 0.8 µm.

Further, in some embodiments, a content ratio of the heat conductive filler may be about 25 volume % to about 60 volume % of the heat transfer sheet. When the content ratio of the heat conductive material is within this range, the heat transfer sheet may be made flexible enough to firmly adhere to the contact surface between the mounting table and the focus ring even if the contact surface has irregularities. Further, in this range, heat conductivity can be made uniform with less deviation over the entire region of the heat transfer sheet.

Furthermore, the flexibility of the heat transfer sheet may be indicated by, e.g., hardness or elastic modulus. By way of example, the heat transfer sheet in some embodiments may have an asker C hardness in a range from about 3 to about 60 or a storage modulus in a range from about 0.5 to about 10. In such ranges, the heat transfer sheet may be made flexible enough to securely fill the minute gap between the susceptor facing surface 40 and the focus ring mounting surface 39.

Moreover, when the anti-adhesion layer 42 is formed, an ultraviolet ray having a wavelength of about 120 nm to about 400 nm at an illuminance of about 1 mW/cm$^2$ to about 1000 mW/cm$^2$ may be irradiated such that a total irradiation amount is within a range from about 10 mJ/cm$^2$ to about 1,000,000 mJ/cm$^2$. Further, a light source used for the irradiation of the ultraviolet ray may not be particularly limited as long as the light source emits an ultraviolet ray having a wavelength of about 120 nm to about 400 nm. By way of example, a high pressure mercury lamp or an extra-high pressure mercury lamp, a xenon lamp, a metal halide lamp, an Excimer lamp, an LED, a laser diode, or the like may be used. Among them, desirably, an Excimer lamp, especially, an Excimer lamp charged with a Xe gas (having a wavelength of about 172 nm) or a Kr$^2$ gas (having a wavelength of about 146 nm) or the like may be used as the light source. By using such a light source, if an ultraviolet ray having a wavelength of about 140 nm to about 180 nm at an illuminance of about 3 mW/cm$^2$ to about 100 mW/cm$^2$ is irradiated such that a total irradiation amount is within a range of from about 400 mJ/cm$^2$ to about 10,000 mJ/cm$^2$, an anti-adhesion effect of the anti-adhesion layer can be improved.

Moreover, an additive such as a photo initiator that triggers ultraviolet ray hardening may not always need to be mixed into the heat transfer sheet. Especially, when additive reaction silicon, which has polyorganosiloxane composed of a siloxane unit as a main chain structure and has a vinyl group and a hydrosilyl group as a crosslinkable reaction point, is used as a base material of the heat transfer sheet, the additive such as a photo initiator that triggers the ultraviolet ray hardening may not need to be mixed into the base material. Without such an additive, the anti-adhesion layer 42 could be formed by the irradiation of the ultraviolet ray.

Now, a focus ring in accordance with a second embodiment of the present disclosure will be described.

Since a configuration and an operation of the second embodiment are basically the same as those of the above-described first embodiment, redundant description thereof will be omitted and only distinctive features will be focused and elaborated.

Figure 4:
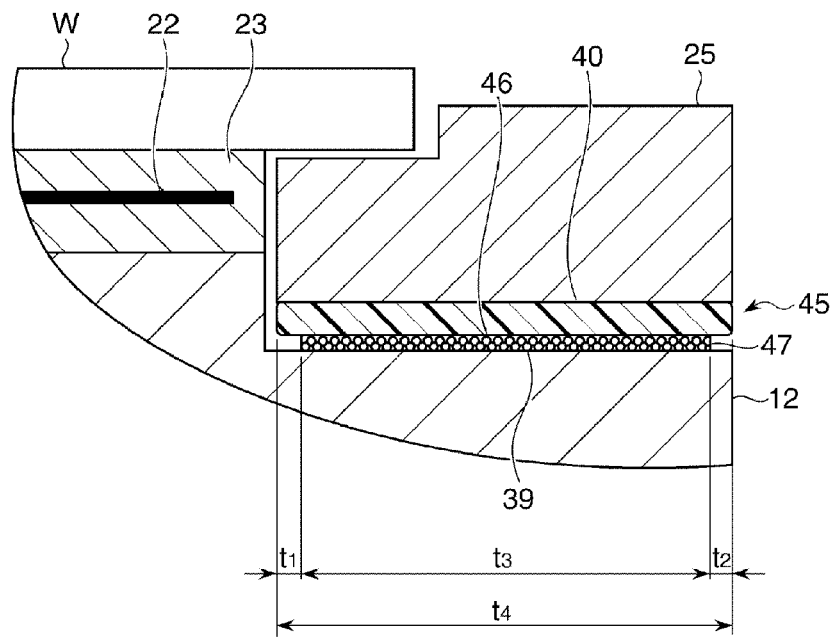
FIG. 4 is an enlarged cross sectional view schematically illustrating a focus ring, a heat transfer sheet and a part in the vicinity of a focus ring mounting surface in accordance with a second embodiment of the present disclosure.

FIG. 4 is an enlarged cross sectional view schematically illustrating a focus ring, a heat transfer sheet and a part in the vicinity of a focus ring mounting surface in accordance with the second embodiment.

As depicted in FIG. 4, the focus ring 25 may have, on its susceptor facing surface 40, a heat transfer sheet 45 made of a heat-resistant organic material as a base material. Since the heat transfer sheet 45 is formed on the susceptor facing surface 40 of the focus ring 25 having an annular shape, the heat transfer sheet 45 may also have an annular shape.

Prior to conceiving the focus ring in accordance with the second embodiment, the present inventor has conducted experiments for preventing adhesion of a heat transfer sheet by using test pieces.

Figure 5A:
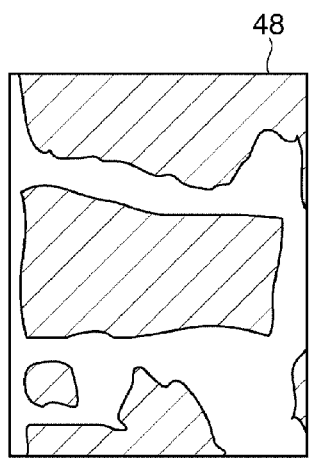
FIGS. 5A to 5D are diagrams showing experimental results of preventing adhesion of quasi heat transfer sheets in accordance with the second embodiment.
Figure 5C:
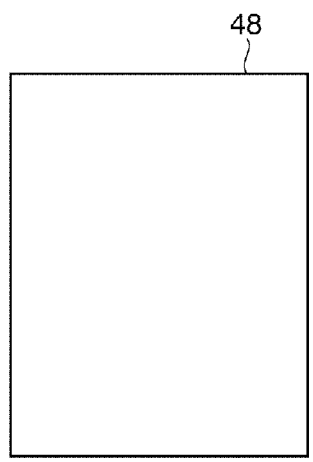
Figure 5B:
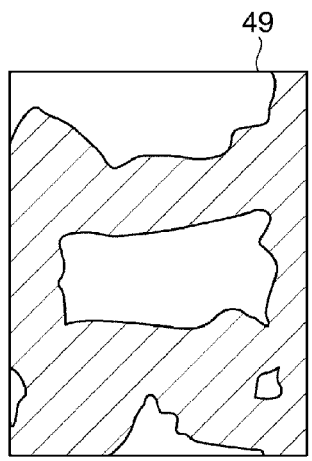

To elaborate, in a comparative example 4, a test piece 48 cut off from a silicon wafer was prepared as a member corresponding to the focus ring 25, and a test piece 49 made of an aluminum plate of which surface is coated with thermally sprayed alumina was prepared as a member corresponding to a susceptor 12. Then, a quasi heat transfer sheet was formed on the test piece 48 in the same manner as in the comparative example 1. Thereafter, the test piece 48 and the test piece 49 were kept attached to each other with the quasi heat transfer sheet interlayered therebetween under the same conditions as those in the comparative example 1. Thereafter, the test piece 48 and the test piece 49 were separated, and a state of the quasi heat transfer sheet remaining on the test piece 48 (FIG. 5A) and a state of the heat transfer sheet adhering to the test piece 49 (FIG. 5B) were observed. In FIGS. 5A and 5B, white parts represent the quasi heat transfer sheet.

Figure 5D:
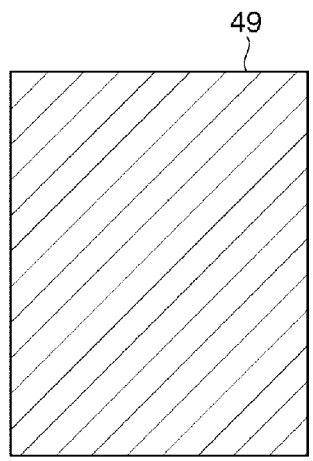

Then, in an experimental example 2, a test piece 48 and a test piece 49 were prepared as separate pieces from the comparative example 4. Then, after a quasi heat transfer sheet was formed on the test piece 48 in the same manner as in the experimental example 1, an anti-adhesion layer containing a multiple number of boron nitride particulates was formed on a surface of the quasi heat transfer sheet by spraying and blowing the multiple number of boron nitride particulates through the use of a spray-type boron nitride lubricant (product name: Boron Spray) manufactured by DENKI KAGAKU KOGYO KABUSHIKI KAISHA. Then, the test piece 48 and the test piece 49 were kept firmly attached to each other for about one hour under the same conditions as in the comparative example 1 so as to allow the anti-adhesion layer to be in firm contact with the test piece 49. Thereafter, the test piece 48 and the test piece 49 were separated, and a state of the quasi heat transfer sheet remaining on the test piece 48 (FIG. 5C) and a state of the heat transfer sheet adhering to the test piece 49 (FIG. 5D) were observed. In FIGS. 5C and 5D, white parts represent the quasi heat transfer sheet.

In the comparative example 4, about 80% of the quasi heat transfer sheet was found to be transferred from the test piece 48 to the test piece 49 and adhere to the test piece 49. In contrast, in the experimental example 2, the quasi heat transfer sheet was found not to be transferred from the test piece 48 to the test piece 49 at all and no quasi heat transfer sheet was found to adhere to the test piece 49. That is, it was proved that adhesion of a part of the quasi heat transfer sheet to the test piece 49 can be prevented by providing the anti-adhesion layer containing the multiple number of boron nitride particulates on the quasi heat transfer sheet.

Further, in a comparative example 5, a test piece 48 and a test piece 49 were prepared. Then, after a quasi heat transfer sheet was formed on the test piece 48 in the same manner as in the experimental example 1, a solution prepared by distributing (dispersing) powder of spherical alumina (having an average particle diameter of about 10 μm) in isopropanol (a concentration of the spherical alumina in the solution is about 20 weight %) was coated on a surface of the quasi heat transfer sheet. Then, the isopropanol was dried, so that a spherical alumina layer containing a multiple number of spherical alumina particles was formed on the surface of the quasi heat transfer sheet. Then, the test piece 48 and the test piece 49 were kept firmly attached to each other for about one hour under the same conditions as in the comparative example 1 so as to allow the spherical alumina layer to be in firm contact with the test piece 49. Thereafter, the test piece 48 and the test piece 49 were separated, and a state of the quasi heat transfer sheet remaining on the test piece 48 and a state of the quasi heat transfer sheet adhering to the test piece 49 were observed. As a result, it was found out that about 50% of the quasi heat transfer sheet was transferred from the test piece 48 to the test piece 49 and adhered to the test piece 49. That is, it was proved that adhesion of a part of the quasi heat transfer sheet cannot be prevented even if the spherical alumina layer is formed on the quasi heat transfer sheet, and it is important to form the anti-adhesion layer by using peelable (delaminatable) heat conductive particulates.

The focus ring in accordance with the second embodiment has been derived from the above considerations.

To elaborate, in accordance with the second embodiment, the heat transfer sheet 45 may have an anti-adhesion layer 47 formed on a susceptor contact surface 46 in order to prevent adhesion of the heat transfer sheet 45 to the focus ring mounting surface 39. The anti-adhesion layer 47 may contain a multiple number of boron nitride particulates (indicated by "O" in FIG. 4) distributed in the susceptor contact surface 46 of the heat transfer sheet 45 formed on the susceptor facing surface 40.

Meanwhile, typically, the focus ring 25 may be worn out slightly whenever a plasma etching process is performed repeatedly. Thus, if an accumulated time of the plasma etching process exceeds about 500 hours, the focus ring 25 needs to be replaced.

Figure 6:
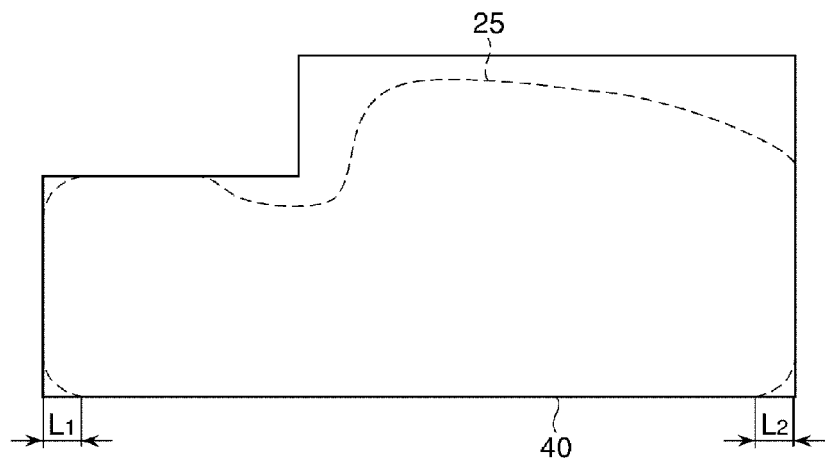
FIG. 6 is a cross sectional view of a focus ring after plasma etching processes are performed for an accumulated time of about 500 hours.

FIG. 6 is a cross sectional view of a focus ring on which a plasma etching process has been performed for an accumulated time of about 500 hours.

In FIG. 6, as indicated by a dashed line, corners of the focus ring 25 are worn out. Especially, an area (indicated by "$L_1$" of FIG. 6) of the susceptor facing surface 40 within about 1 mm from an inner periphery of the focus ring 25 toward an outer periphery thereof in a radial direction is worn out by plasma, and an area (indicated by "$L_2$" of FIG. 6) of the susceptor facing surface 40 within about 1 mm from the outer periphery of the focus ring 25 toward the inner periphery thereof in the radial direction is also worn out. Thus, if the anti-adhesion layer 47 is formed on the area $L_1$ or $L_2$, the anti-adhesion layer 47 would be destroyed by the plasma, which may result in dispersion of the boron nitride particulates into the chamber 11.

To solve the problem, in accordance with the second embodiment, the anti-adhesion layer 47 is not formed on the entire susceptor contact surface 46 of the heat transfer sheet 45. To be specific, the anti-adhesion layer 47 is not formed on an area (indicated by "$t_1$" of FIG. 4) of the susceptor contact surface 46 within about 1 mm from an inner periphery of the heat transfer sheet 45 toward an outer periphery thereof in a radial direction and an area (indicated by "$t_2$" of FIG. 4) of the susceptor contact surface 46 within about 1 mm from the outer periphery of the heat transfer sheet 45 toward the inner periphery thereof in the radial direction.

Furthermore, since an inner peripheral area of the focus ring 25 is severely worn out by the plasma etching process, the effect of preventing dispersion of the boron nitride particulates can be sufficiently achieved just by forming no anti-adhesion layer 47 on the area $t_1$. Accordingly, it may be enough not to form the anti-adhesion layer 47 on the area $t_1$ in order to obtain the desired effect.

Moreover, only the anti-adhesion layer 47 is in direct contact with the focus ring mounting surface 39 and not the entire susceptor contact surface 46 of the heat transfer sheet 45 is in contact with the focus ring mounting surface 39. If a contact area between the anti-adhesion layer 47 and the focus ring mounting surface 39 is small, heat of the focus ring 25 may not be efficiently transferred to the susceptor 12 and thus, it may become difficult to cool the focus ring 25 by a coolant flowing through the coolant cavity 26 of the susceptor 12. If a temperature of the focus ring 25 is difficult to control, the temperature of the focus ring 25 would be increased, resulting in an increase of a temperature of a peripheral portion of the wafer W. As a consequence, an etching rate of the peripheral portion of the wafer W may become different from etching rates of the other portions of the wafer W.

The present inventor has investigated a variation of the etching rate of the peripheral portion of the wafer W in the plasma processing apparatus 10 while varying a width of the anti-adhesion layer 47 in a radial direction from an inner periphery of the susceptor contact surface 46 toward an outer periphery thereof. As a result, it was proved that if the width of the anti-adhesion layer 47 is equal to or larger than about 50% of the width of the susceptor contact surface 46 in the radial direction, the etching rate of the peripheral portion of the wafer W may not be different from the etching rates of the other portions of the wafer W.

In consideration of the above, in accordance with the second embodiment, the width (indicated by $t_3$ of FIG. 4) of the anti-adhesion layer 47 from the inner periphery of the susceptor contact surface 46 toward the outer periphery thereof in the radial direction may be set to be equal to or larger than about 50% of the width (indicated by $t_4$ of FIG. 4) of the susceptor contact surface 46 in the radial direction.

Furthermore, the present inventor has also investigated whether heat resistance of the heat transfer sheet 45 varies as a result of forming the anti-adhesion layer 47 on the susceptor contact surface 46 of the heat transfer sheet 45. To elaborate, in the above-described experimental example 2, four sheets of test pieces 48 having thereon quasi heat transfer sheets of different thicknesses were prepared. Then, each anti-adhesion layer containing a multiple number of boron nitride particulates was formed on a surface of each quasi heat transfer sheet by using a spray-type boron nitride lubricant (product name: Boron Spray) manufactured by DENKI KAGAKU KOGYO KABUSHIKI KAISHA. Then, each of the test pieces 48 and each of test pieces 49 were kept firmly attached to each other for about one hour so as to allow each of the anti-adhesion layers to be in firm contact with each of the test pieces 49. Thereafter, heat resistances from the test pieces 48 to the test pieces 49, i.e., heat resistances of the quasi heat transfer sheets having the anti-adhesion layers formed thereon were measured, and the results are provided by "□" in a graph of FIG. 7.

Further, in the above-described comparative example 4, four sheets of test pieces 48 having thereon quasi heat transfer sheets of different thickness were prepared. Then, without forming an anti-adhesion layer on a surface of each quasi heat transfer sheet, each of the test pieces 48 and each of test pieces 49 were kept firmly attached to each other so as to allow each of the quash heat transfer sheets to be in firm contact with each of the test pieces 49. Then, heat resistances from the test pieces 48 to the test pieces 49, i.e., heat resistances of the quasi heat transfer sheets without having the anti-adhesion layers were measured, and the results are provided by "◇" in the graph of FIG. 7.

Figure 7:
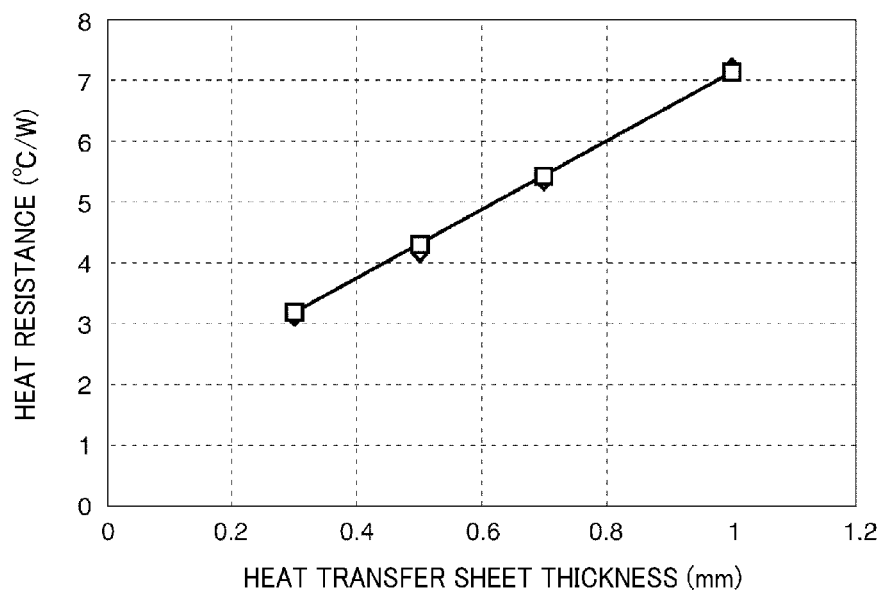
FIG. 7 is a graph showing a relationship between a heat resistance and a thickness of each of a quasi heat transfer sheet having an anti-adhesion layer and a quasi heat transfer sheet without having an anti-adhesion layer.

As can be seen from the graph of FIG. 7, it was found out that presence or absence of the anti-adhesion layer does not affect the heat resistances of the quasi heat transfer sheets. That is, even when the anti-adhesion layer 47 is formed on the susceptor contact surface 46 of the heat transfer sheet 45, the heat resistance of the heat transfer sheet 45 is not varied, and the temperature control of the focus ring 25 may not become difficult.

In accordance with the second embodiment, the anti-adhesion layer 47 may be made of a multiple number of boron nitride particulates. In a crystal structure of boron nitride, since layers are bonded by a weak van der Waals force, one layer may easily peel off. That is, the crystal structure of boron nitride has high peelability (delaminatability). Besides the boron nitride, graphite also has a crystal structure similar to that of the boron nitride, so that the graphite also has high peelability. Accordingly, the anti-adhesion layer 47 can be made of a multiple number of graphite particulates. Since the boron nitride and the graphite are non-metal, even if the boron nitride or the graphite is dispersed within the chamber 11, they would not cause metal contamination within the chamber 11 and they would not cause severe damage on a semiconductor device on the wafer W.

As highly heat conductive particulates, it may be considered to use alumina particulates. Since, however, alumina is unlikely to peel off in its crystal structure, high peelability may not be obtained. Furthermore, typically, a material without having high peelability in a crystal structure may have poor adhesiveness to other materials and thus have low heat conductivity. In this regard, since the boron nitride and the graphite have high heat conductivity as well as high peelability, the boron nitride and the graphite may be regarded as optimum materials for forming the anti-adhesive layer 47.

Furthermore, a diameter of the boron nitride particulates used for the anti-adhesion layer 47 may be in a range from about 1 μm to about 20 μm, and the anti-adhesion layer 47 may have a thickness equal to or larger than the thickness capable of allowing interlayer peeling in the crystal structure of the boron nitride. Further, by way of example, a maximum particle diameter may be equal to or less than about 15 μm, more desirably, equal to or less than about 10 μm.

As for the focus ring 25 in accordance with the second embodiment 25, since the anti-adhesion layer 47 contains the multiple number boron nitrogen particulates distributed on the susceptor contact surface 46 of the heat transfer sheet 45, the heat transfer sheet 45 can be easily peeled (delaminated) from the focus ring mounting surface 39 when the focus ring 25 is separated from the susceptor 12. Accordingly, it can be certainly prevented that a part of the heat transfer sheet 45 adheres to and remains on the focus ring mounting surface 39.

In the above-described focus ring 25, since the anti-adhesion layer 47 is not formed at least on the area $t_1$ of the annular heat transfer sheet 45, the anti-adhesion layer 47 may not be exposed to the plasma, so that dispersion of the boron nitride particulates into the chamber 11 can be prevented.

Moreover, in the above-described focus ring 25, the width ($t_3$ of FIG. 4) of the anti-adhesion layer 47 may be set to be equal to or larger than about 50% of the width of the susceptor contact surface 46 in a radial direction from the inner periphery toward the outer periphery of the susceptor contact surface 46. With this configuration, the heat of the focus ring 25 can be efficiently transferred to the susceptor 12 and, thus, the temperature of the focus ring 25 can be controlled by the coolant flowing through the coolant cavity 26 of the susceptor 12.

In the above-described focus ring 25, since the multiple number of boron nitride particulates are blown (sprayed) onto the susceptor contact surface 46, imbalance distribution of the boron nitride particulates on the susceptor contact surface 46 of the heat transfer sheet 45 can be prevented and the anti-adhesion layer 47 can be easily formed.

Now, a focus ring in accordance with a third embodiment of the present disclosure will be discussed.

Since a configuration and an operation of the third embodiment are basically the same as those of the above-described second embodiment, redundant description thereof will be omitted and only distinctive features will be focused and elaborated.

Figure 8:
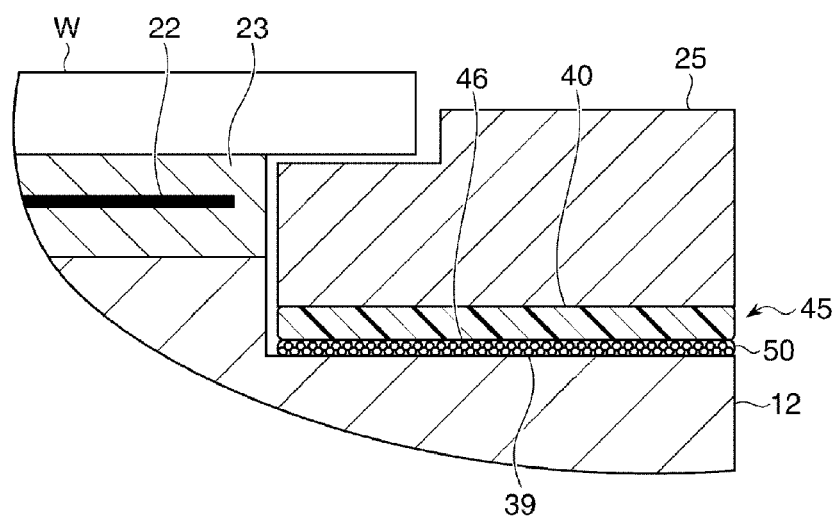
FIG. 8 is an enlarged cross sectional view schematically illustrating a focus ring, a heat transfer sheet and a part in the vicinity of a focus ring mounting surface in accordance with a third embodiment of the present disclosure.

FIG. 8 is an enlarged cross sectional view schematically illustrating a focus ring, a heat transfer sheet and a part in the vicinity of a focus ring mounting surface in accordance with the third embodiment.

As depicted in FIG. 8, a focus ring 25 may have, on a susceptor facing surface 40 thereof, a heat transfer sheet 45 made of a heat-resistant organic material as a base material, and the heat transfer sheet 45 may have an anti-adhesion layer 50 formed on a susceptor contact surface 46 thereof. The anti-adhesion layer 50 may contain a multiple number of boron nitride particulates (indicated by "O" in FIG. 8) distributed on the susceptor contact surface 46 of the heat transfer sheet 45.

Unlike the anti-adhesion layer 47, the anti-adhesion layer 50 may not be formed by blowing (spraying) the boron nitride particulates but may be formed by coating such as screen printing.

Figure 9A:
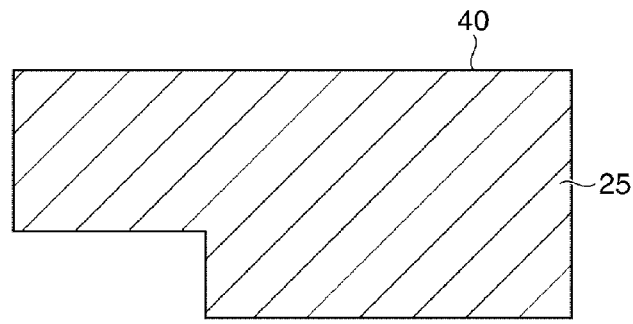
FIGS. 9A to 9C are process diagrams for describing a method for forming a heat transfer sheet and an anti-adhesion layer of the focus ring in accordance with the third embodiment.
Figure 9B:
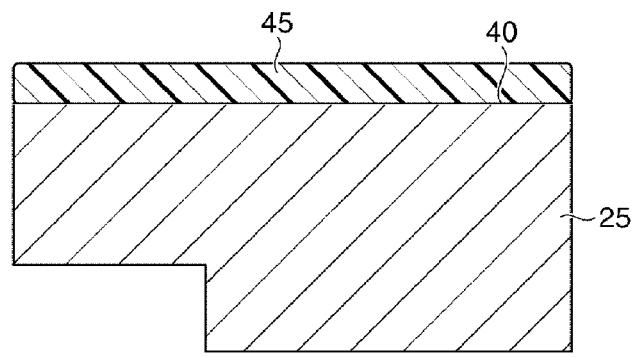
Figure 9C:
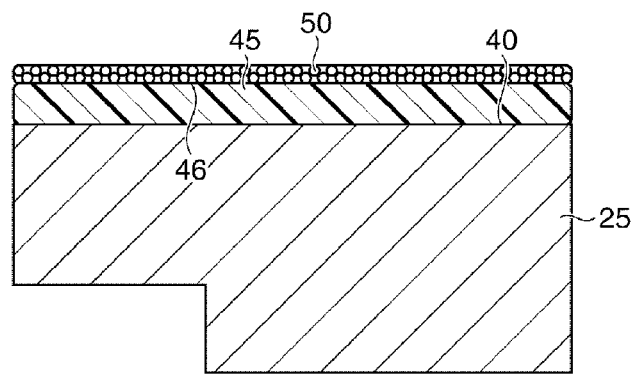

FIGS. 9A to 9C are process diagrams for describing a method for forming the heat transfer sheet and the anti-adhesion layer of the focus ring in accordance with the third embodiment.

Referring to FIGS. 9A to 9C, the focus ring 25 is positioned with its susceptor facing surface 40 facing upward (FIG. 9A). Then, a paste, which is prepared by mixing a multiple number of heat conductive fillers into a sol-type silicon-containing heat-resistant material (not cross-linked yet), is coated on the entire susceptor facing surface 40 in a uniform thickness in a range from, e.g., about 40 μm to about 80 μm by screen printing, and the paste is gelated to a hardened body by a cross-linking reaction, so that the heat transfer sheet 45 is formed (FIG. 9B). Here, by way of example, XE14-B8530 (A) (manufactured by Momentive Performance Materials Inc.) and XE14-B8530(B) (manufactured by Momentive Performance Materials Inc.) used as polyorganosiloxane may be mixed at a weight ratio of about 1:1, so that a mixed solution (hereinafter, referred to as a "mixed solution A") may be prepared. Then, DAM5 (manufactured by DENKI KAGAKU KOGYO KABUSHIKI KAISHA and having an average particle diameter of about 5 μm) may be added to the mixed solution A as alumina fillers at a ratio (volume ratio) of mixed solution A:alumina fillers=60:40. Further, RD-1 (manufactured by Toray Dow Corning Co., Ltd.) serving as a cross-linkable polyorganosiloxane-based hardener may be added to and mixed with the mixture of the mixed solution A and the alumina fillers such that an amount of the RD-1 may be about 0.04 weight % of the sum of the weights of the mixed solution A and the alumina fillers, so that a mixed solution (hereinafter, referred to as a "mixed solution B") was prepared. The mixed solution B may be coated by screen printing (for example, using an apparatus named "Sbechia SM" manufactured by Mino Group Co., Ltd). Then, the heat transfer sheet may be formed by a cross-linking reaction by heating the coated mixed solution B at about 150° C. for about 30 hours, thus gelating the coated mixed solution B to a hardened body.

Subsequently, a paste, which is prepared by mixing a multiple number of boron nitride particulates (marked by "O" in FIG. 9C) into a sol-type silicon-containing heat-resistant material (not cross-linked yet), is coated on the entire susceptor contact surface 46 of the heat transfer sheet 45 in a uniform thickness of, e.g., about 20 μm by screen printing, and the paste is gelated to a hardened body by a cross-linking reaction, so that the anti-adhesion layer is obtained (FIG. 9C). Here, by way of example, XE14-B8530(A) (manufactured by Momentive Performance Materials Inc.) and XE14-B8530 (B) (manufactured by Momentive Performance Materials Inc.) used as polyorganosiloxane may be mixed at a weight ratio of about 1:1, so that a mixed solution (hereinafter, referred to as a "mixed solution C") may be prepared. Then, SP-2 (Denka boron nitride manufactured by DENKI KAGAKU KOGYO KABUSHIKI KAISHA and having an average particle diameter of about 3 μm) may be added to the mixed solution C as the boron nitride particulates at a ratio (volume ratio) of mixed solution C:boron nitride particulates=60:40. Further, RD-1 (manufactured by Toray Dow Corning Co., Ltd.) which is a crosslinkable polyorganosiloxane-based hardener may be added to and mixed with the mixture of the mixed solution C and the boron nitride particulates such that an amount of the RD-1 may be about 0.04 weight % of the sum of the weights of the mixed solution C and the boron nitride particulates, so that a mixed solution (hereinafter, referred to as a "mixed solution D") may be prepared. The mixed solution D may be coated by screen printing (for example, using an apparatus named "Sbechia SM" manufactured by Mino Group Co., Ltd). Then, the anti-adhesion layer may be formed by a cross-linking reaction by heating the coated mixed solution D at about 150° C. for about 30 hours, thus gelating the coated mixed solution D to a hardened body.

As for the focus ring 25 in accordance with the third embodiment, since the anti-adhesion layer 50 is formed by coating the paste mixed with the multiple number of boron nitride particulates on the susceptor contact surface 46 of the heat transfer sheet 45 by using the screen printing, the anti-adhesion layer 50 can be easily formed.

Although the above-described anti-adhesion layer 50 is formed on the entire susceptor contact surface 46 in accordance with the third embodiment, the anti-adhesion layer 50 may be easily formed on the susceptor contact surface 46 in a desired shape because the anti-adhesion layer is formed by the screen printing.

Moreover, besides using the method of forming the anti-adhesion layer by screen printing, it may be also possible to form the anti-adhesion layer by spreading and coating the paste mixed with the multiple number of boron nitride particulates on the susceptor contact surface of the heat transfer sheet by using a coating means such as a brush. Here, the paste mixed with the multiple number of boron nitride particulates may be prepared by distributing (dispersing) the boron nitride particulates in an organic solvent such as methanol, ethanol or isopropanol, or may be prepared by distributing (dispersing) the boron nitride particulates in a solution in which a sol-type silicon-containing heat-resistant material having crosslinkable property, such as polyorganosiloxane, is dissolved in an organic solvent.

Figure 10A:
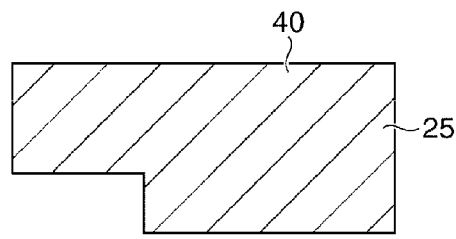
FIGS. 10A to 10E are process diagrams for describing a modification example of the method for forming the heat transfer sheet and the anti-adhesion layer of the focus ring in accordance with the third embodiment.
Figure 10B:
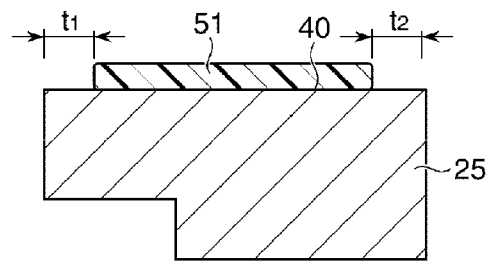

FIGS. 10A to 10E are process diagrams for describing a modification example of the method for forming the heat transfer sheet and the anti-adhesion layer of the focus ring in accordance with the third embodiment;

Referring to FIGS. 10A to 10E, a focus ring 25 is positioned with its susceptor facing surface 40 facing upward (FIG. 10A). Then, a paste prepared by mixing a multiple number of heat conductive fillers into a sol-type silicon-containing heat-resistant material (not cross-linked yet) is coated on the entire susceptor facing surface 40 in a uniform thickness in a range from, e.g., about 40 µm to about 80 µm. Here, the paste is coated lest the heat transfer sheet 51 be formed on an area ("area $t_1$" of FIG. 10B) within about 1 mm from the inner periphery of the susceptor facing surface 40 toward the outer periphery thereof in a radial direction and an area ("area $t_2$" of FIG. 10B) within about 1 mm from the outer periphery of the susceptor facing surface 40 toward the inner periphery thereof in the radial direction. Thereafter, the paste is gelated to a hardened body by a cross-linking reaction, so that a heat transfer sheet 51 is formed (FIG. 10B).

Figure 10C:
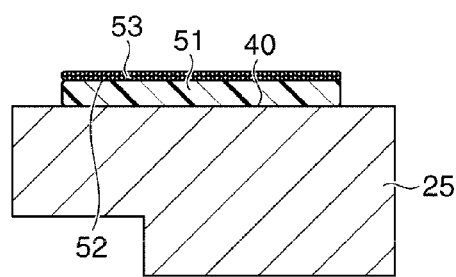

Subsequently, a paste prepared by mixing a multiple number of boron nitride particulates (marked by "O" in FIG. 10C) into a sol-type silicon-containing heat-resistant material (not cross-linked yet) is coated on the entire susceptor contact surface 52 of the heat transfer sheet 51 in a uniform thickness of, e.g., about 20 µm by screen printing. Then, the paste is gelated to a hardened body by a cross-linking reaction, so that an anti-adhesion layer 53 is obtained (FIG. 10C).

Figure 10D:
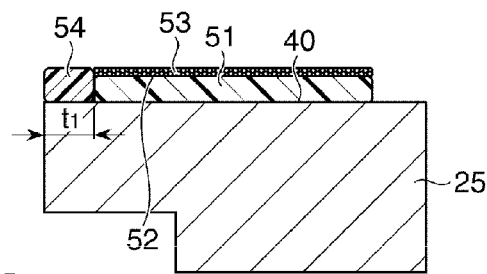
Figure 10E:
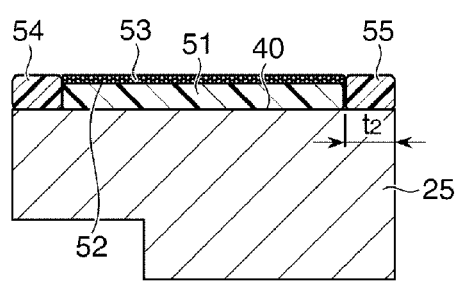

Thereafter, a paste prepared by mixing a multiple number of heat conductive fillers into a sol-type silicon-containing heat-resistant material (not cross-linked yet) is coated on the area $t_1$ of the susceptor facing surface 40 in a uniform thickness of, e.g., about 80 µm by screen printing, and the paste is gelated by a cross-linking reaction, so that a heat transfer sheet 54 is formed (see FIG. 10D). Afterward, the paste prepared by mixing the multiple number of heat conductive fillers with the sol-type silicon-containing heat-resistant material (not cross-linked yet) is coated on the area $t_2$ of the susceptor facing surface 40 in a uniform thickness of, e.g., about 80 µm by screen printing, and the paste is gelated to a hardened body by a cross-linking reaction, so that a heat transfer sheet 55 is formed (see FIG. 10E).

In accordance with the method for forming the heat transfer sheet and the anti-adhesion layer illustrated in FIGS. 10A to 10E, since the heat transfer sheets 51, 54 and the anti-adhesion layer 53 are formed by screen printing, the heat transfer sheets 51, 54 and 55 and the anti-adhesion layer 53 can be easily formed lest the anti-adhesion layer 53 be formed on the area within about 1 mm from the inner periphery of the susceptor facing surface 40 toward the outer periphery thereof in the radial direction and on the area within about 1 mm from the outer periphery of the susceptor facing surface 40 toward the inner periphery thereof in the radial direction.

Now, a focus ring in accordance with a fourth embodiment of the present disclosure will be explained.

Since a configuration and an operation of the fourth embodiment are basically the same as those of the above-described first embodiment excepting that a structure of an anti-adhesion layer and a method for forming the same are different from those in the first embodiment. Thus, redundant description will be omitted and only distinctive features will be focused and elaborated.

Figure 11:
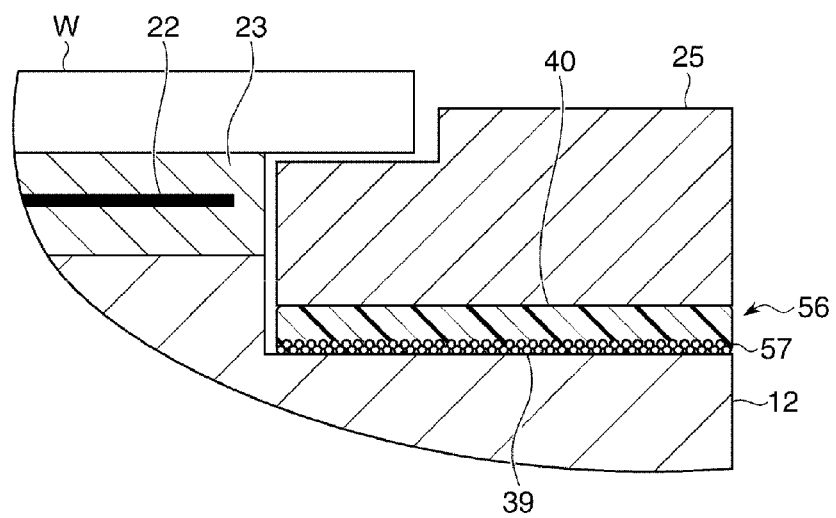
FIG. 11 is an enlarged cross sectional view schematically illustrating a focus ring, a heat transfer sheet and a part in the vicinity a focus ring mounting surface in accordance with a fourth embodiment of the present disclosure.

FIG. 11 is an enlarged cross sectional view schematically illustrating a focus ring, a heat transfer sheet and a part in the vicinity of the focus ring in accordance with the fourth embodiment.

As depicted in FIG. 11, a focus ring 25 may have, on its susceptor facing surface 40, a heat transfer sheet 56 made of a heat-resistant organic material as a base material, and the heat transfer sheet 56 may have an anti-adhesion layer 57 formed on a focus ring mounting surface 39 thereof. The anti-adhesion layer 57 may be configured as a part of the heat transfer sheet 56 on the side of the focus ring mounting surface 39. Further, the anti-adhesion layer 57 containing therein a multiple number of boron nitride particulates (indicated by "O" in FIG. 11) may be formed by irradiating an ultraviolet ray to harden the anti-adhesion layer 57.

FIGS. 12A to 12F are process diagrams for describing a method for forming the heat transfer sheet and the anti-adhesion layer of the focus ring in accordance with the fourth embodiment.

Figure 12A:
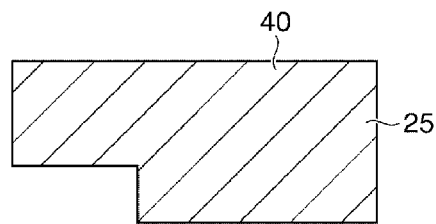
FIGS. 12A to 12F are process diagrams for describing a method for forming a heat transfer sheet and an anti-adhesion layer of the focus ring in accordance with the fourth embodiment.
Figure 12B:
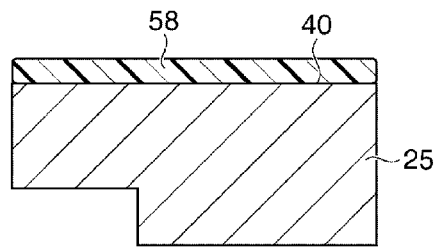

Referring to FIGS. 12A to 12F, a focus ring 25 is positioned with its susceptor facing surface 40 facing upward (FIG. 12A). Then, a paste prepared by mixing a multiple number of heat conductive fillers into a sol-type silicon-containing heat-resistant material (not cross-linked yet) is coated on the entire susceptor facing surface 40 in a film shape having a uniform thickness of, e.g., about 80 µm by screen printing (FIG. 12B).

Figure 12C:
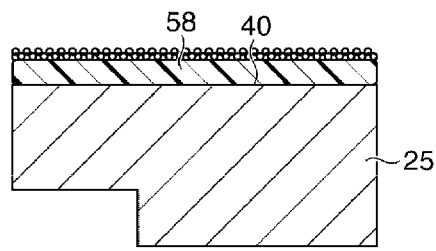
Figure 12D:
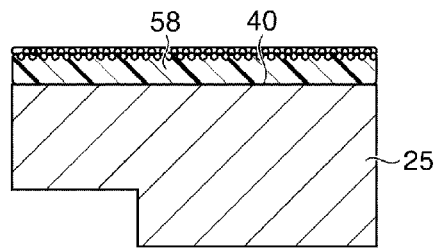

Subsequently, before the coated film-shaped paste 58 is gelated to a hardened body by a cross-linking reaction, a multiple number of boron nitride particulates (indicated by "O" in FIG. 12C) are blown (sprayed) onto a top surface of the film-shaped paste 58 (on the side of the focus ring mounting surface 39) (FIG. 12C). The blown boron nitride particulates may settle down into the film-shaped paste and stay in the vicinity of the surface on the side of the focus ring mounting surface 39.

Figure 12E:
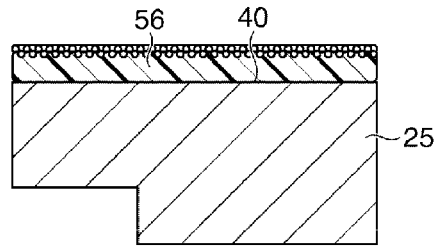
Figure 12F:
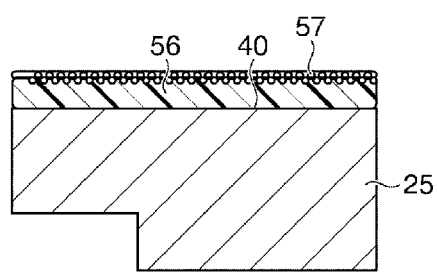

Then, the film-shaped paste 58 is gelated to a hardened body by a cross-linking reaction, so that a heat transfer sheet 56 is formed (FIG. 12E). Thereafter, by irradiating an ultraviolet ray to a top surface of the heat transfer sheet 56 (on the side of the focus ring mounting surface 39) and a part of the heat transfer sheet 56 including the multiple number of boron nitride particulates and located on the side of the focus ring mounting surface 39 may be hardened, so that an anti-adhesion layer 57 is formed (FIG. 12F).

As for the focus ring 25 in accordance with the fourth embodiment, since the anti-adhesion layer 57 is a part of the heat transfer sheet 56, which includes the multiple number of boron nitride particulates and located on the side of the focus ring mounting surface 39 and hardened by the ultraviolet ray, the heat transfer sheet 56 may not be attached to the focus ring mounting surface 39 and it can be prevented that a part of the heat transfer sheet 56 adheres to and remains on the focus ring mounting surface 39 when the focus ring 25 is separated from the susceptor 12. Furthermore, since the multiple number of boron nitride particulates are contained in the hardened heat transfer sheet 56, each boron nitride particulate can be more firmly held by the heat transfer sheet 56. Accordingly, dispersion of the boron nitride particulates can be prevented, which also enables to prevent adhesion of the boron nitride particulates to the wafer W as impurities.

Moreover, although, in the forming method illustrated in FIGS. 12A to 12F, the multiple number of boron nitride particulates are distributed over the entire surface of the film-shaped paste 58 on the side of the focus ring mounting surface 39, the multiple number of boron nitride particulates may not be distributed over the entire surface. By way of example, like the anti-adhesion layer 47 in accordance with the second embodiment, the multiple number of boron nitride particulates may be distributed in the surface of the film-shaped paste 58 on the side of the focus ring mounting surface 39 lest the boron nitride particulates be distributed near an inner periphery of the susceptor facing surface 40 and/or near an outer periphery thereof.

In addition, a substrate on which a plasma etching process is performed may not be limited to a wafer for a semiconductor device. By way of example, various types of substrates for use in a FPD (Flat Panel Display) including a LCD (Liquid Crystal Display), a photomask, a CD substrate, a print substrate, or the like may be used.

What is claimed is:

1. A focus ring arranged to surround a periphery of a substrate mounted on a mounting table having a temperature control device, the focus ring comprising:
  a flexible heat transfer sheet,
  wherein the focus ring is in contact with the mounting table via the heat transfer sheet, and
  the heat transfer sheet has a contact surface in contact with the mounting table and an anti-adhesion layer formed on the contact surface, wherein the anti-adhesion layer is located between said contact surface of the heat transfer sheet and a mounting surface of the mounting table,
  wherein the anti-adhesion layer contains heat conductive particulates,
  the heat transfer sheet is formed in an annular shape, and
  the anti-adhesion layer is not formed on areas of said contact surface within at least about 1 mm from an inner periphery of the heat transfer sheet toward an outer periphery thereof, and within at least about 1 mm from an outer periphery of the heat transfer sheet toward an inner periphery thereof, in a radial direction of the annular shape of the heat transfer sheet, so that respective gaps are formed between said contact surface of the heat transfer sheet and the mounting surface of the mounting table at said areas where the anti-adhesion layer is not formed.

2. The focus ring of claim 1, wherein the anti-adhesion layer is a part of the heat transfer sheet, and the anti-adhesion layer is formed by irradiating an ultraviolet ray to the contact surface to harden the contact surface.

3. The focus ring of claim 2, wherein the anti-adhesion layer is formed by irradiating the ultraviolet ray having a wavelength of about 120 nm to about 400 nm at an illuminance of about 1 mW/cm$^2$ to 1000 mW/cm$^2$ such that a total irradiation amount is in a range from about 10 mJ/cm$^2$ to about 1,000,000 mJ/cm$^2$.

4. The focus ring of claim 1, wherein the heat conductive particulates contain boron nitride or graphite.

5. The focus ring of claim 1, wherein the anti-adhesion layer contains heat conductive particulates, and
  the anti-adhesion layer is formed by irradiating an ultraviolet ray to the contact surface to harden the contact surface.

6. The focus ring of claim 1, wherein a width of the anti-adhesion layer in the radial direction is equal to or larger than about 50% of a width of the contact surface in the radial direction.

7. The focus ring of claim 1, wherein an Asker C hardness of the heat transfer sheet is in a range from about 3 to about 60.

8. The focus ring of claim 1, wherein a storage modulus of the heat transfer sheet at a temperature of about 25° C. is in a range from about 0.5 MPa to about 10 MPa.

* * * * *